United States Patent
White et al.

(10) Patent No.: US 9,959,961 B2
(45) Date of Patent: May 1, 2018

(54) PERMANENT MAGNETIC CHUCK FOR OLED MASK CHUCKING

(71) Applicant: Applied Materials, Inc., Santa Clara, CA (US)

(72) Inventors: John M. White, Hayward, CA (US); Zuoqian Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 299 days.

(21) Appl. No.: 14/463,825

(22) Filed: Aug. 20, 2014

(65) Prior Publication Data

US 2015/0348812 A1    Dec. 3, 2015

Related U.S. Application Data

(60) Provisional application No. 62/006,848, filed on Jun. 2, 2014.

(51) Int. Cl.
| | | |
|---|---|---|
| *H01L 21/683* | (2006.01) | |
| *H01F 7/02* | (2006.01) | |
| *G03F 7/20* | (2006.01) | |

(52) U.S. Cl.
CPC ........... *H01F 7/0252* (2013.01); *G03F 7/707* (2013.01); *H01F 7/0226* (2013.01)

(58) Field of Classification Search
None
See application file for complete search history.

(56) References Cited

U.S. PATENT DOCUMENTS

| | | |
|---|---|---|
| 5,608,773 A | 3/1997 | Korenaga et al. |
| 6,678,143 B2 | 1/2004 | Masuda et al. |
| 6,768,627 B1 | 7/2004 | Kitabayashi et al. |
| 6,781,812 B2 | 8/2004 | Fuwa et al. |
| 7,881,036 B2 | 2/2011 | Fujisawa et al. |
| 7,916,447 B2 | 3/2011 | Kobayashi et al. |
| 8,125,756 B2 | 2/2012 | Poh |
| 8,238,072 B2 | 8/2012 | Fujisawa et al. |
| 8,325,457 B2 | 12/2012 | Park et al. |
| 8,335,070 B2 | 12/2012 | Poh |
| 8,503,156 B2 | 8/2013 | Ray et al. |
| 8,730,644 B2 | 5/2014 | Fujisawa et al. |

(Continued)

FOREIGN PATENT DOCUMENTS

| | | |
|---|---|---|
| JP | H04237148 A | 8/1992 |
| JP | 2002-357838 A | 12/2002 |

(Continued)

OTHER PUBLICATIONS

H. Stieglauer et al, Mobile Electrostatic Carrier (MEC) Evaluation for a GaAs Wafer Backside Manufacturing Process, CS MANTECH Conference, May 17-20, 2010, Portland, Oregon, USA, 5 pages.

(Continued)

*Primary Examiner* — Jethro M Pence
(74) *Attorney, Agent, or Firm* — Patterson + Sheridan LLP (57) ABSTRACT

A permanent magnetic mask chuck is described herein. The permanent magnetic mask chuck includes a body with a plurality of permanent magnets positioned therein. The permanent magnets can then deliver a magnetic force to a mask to position and hold the mask over or on the substrate for further deposition.

8 Claims, 5 Drawing Sheets

(56) References Cited

U.S. PATENT DOCUMENTS

| | | |
|---|---|---|
| 9,287,806 B2 | 3/2016 | Park |
| 2005/0287897 A1 | 12/2005 | Tanaka et al. |
| 2008/0062609 A1 | 3/2008 | Himori et al. |
| 2010/0081355 A1* | 4/2010 | Inoue ................ H01J 9/241 445/24 |
| 2010/0112194 A1 | 5/2010 | Inoue et al. |
| 2011/0045617 A1* | 2/2011 | Kang ................ C23C 14/044 438/22 |
| 2011/0174217 A1 | 7/2011 | Gersdorff et al. |
| 2011/0227275 A1 | 9/2011 | Poh et al. |
| 2012/0227886 A1 | 9/2012 | Hsiao et al. |
| 2014/0284559 A1 | 9/2014 | Kim |
| 2015/0331337 A1 | 11/2015 | Sundarrajan et al. |
| 2016/0064267 A1 | 3/2016 | Toh et al. |

FOREIGN PATENT DOCUMENTS

| | | |
|---|---|---|
| JP | 2003-179128 A | 6/2003 |
| JP | 2003-243493 A | 8/2003 |

OTHER PUBLICATIONS

F. Poh et al, Non-Contact Transportation System for Thin Glass Plate Utilizing Combination of Air Bearing and Electrostatic Force, SICE '99 Jul. 28-30, Morioka, 6 pages.

* cited by examiner

PERMANENT MAGNETIC CHUCK FOR OLED MASK CHUCKING

CROSS-REFERENCE TO RELATED APPLICATIONS

This application claims benefit of U.S. Provisional Patent Application Ser. No. 62/006,848 (APPM/21861L), filed Jun. 2, 2014, which is herein incorporated by reference.

BACKGROUND

Field

Embodiments of the present disclosure generally relate to a permanent magnetic mask chuck, and more particularly, a permanent magnetic mask chuck suitable for use in a vertical and other processing systems.

Description of the Related Art

Opto-electronic devices that make use of organic materials are becoming increasingly desirable for a number of reasons. Many of the materials used to make such devices are relatively inexpensive, so organic opto-electronic devices have the potential for cost advantages over inorganic devices. As well, the inherent properties of organic materials, such as their flexibility, may be advantageous for particular applications such as for deposition or formation on flexible substrates. Examples of organic opto-electronic devices include organic light emitting devices (OLEDs), organic phototransistors, organic photovoltaic cells, and organic photodetectors.

For OLEDs, the organic materials are believed to have performance advantages over conventional materials. For example, the wavelength at which an organic emissive layer emits light may generally be readily tuned with appropriate dopants. OLEDs make use of thin organic films that emit light when voltage is applied across the device. OLEDs are becoming an increasingly interesting technology for use in applications such as flat panel displays, illumination, and backlighting.

The substrates as well as a fine metal mask are often held on a substrate support using mechanical force. Conventional mechanical contacts used to hold the substrate and the mask during processing may often result in substrate damage due to the high mechanical force applied. The mechanical force is further applied to hold the fine metal mask in place during processing. The conventional mechanical carriers generally hold the substrate at the edges, thus resulting in a highly concentrated physical contact at the edges of the substrate so as to ensure sufficient clamping force applied to securely pick up the substrate. This mechanical contact concentrated at the edges of the substrate inevitably creates contact contamination or physical damage, undesirably degrading the substrate.

Newer processing systems have incorporated alternative mechanisms for chucking the substrate to avoid the above described damage, such as holding the substrate in place using electrostatic force. Electrostatic force can effectively hold the substrate in position during processing while minimizing contact between metal components of the system and the substrate. However, the electrostatic force used for chucking the substrate cannot effectively chuck the mask in position as well.

Therefore, there is a need for a method and apparatus for positioning a mask independently of the substrates in a processing system.

SUMMARY

A substrate carrier adapted for use in a processing system including a permanent magnetic mask chuck. The permanent magnetic mask chuck is configured to generate a magnetic chucking force for securing a fine metal mask in position over the substrate and the substrate carrier. The permanent magnetic mask chuck can be independently positioned in connection with the support base.

In one embodiment, a processing system is described. The processing system can include a process chamber configured to deposit a material on the substrate. The processing system can further include a permanent magnetic mask chuck positioned in the process chamber. The permanent magnetic mask chuck can include a positioning device and a plurality of permanent magnets coupled to the positioning device, the positioning device configured to control a magnitude of magnetic force provided to the mask such that the mask is magnetically chucked in position over the substrate.

In another embodiment, a substrate carrier for use in a process chamber is described. The substrate carrier can include a support base configured to move into and out of a process chamber. The support base can include a substrate supporting surface and an electrode assembly operable to electrostatically chuck a substrate to the substrate supporting surface. The substrate carrier can further include a permanent magnetic mask chuck coupled to the support base. The permanent magnetic mask chuck can include a chuck body having a first wall and a second wall, the first wall being proximate to the support base and the second wall being distal to the support base, a plurality of permanent magnets positioned in the chuck body, the permanent magnets having a magnetic field and a positioning device to move the permanent magnetic mask chuck independent of the support base.

In another embodiment, a method for chucking a mask in a process chamber is described. The method can include transferring a substrate disposed on a substrate supporting surface of a substrate carrier into a process chamber. Then, a magnetic chuck can be moved towards the substrate supporting surface such that a plurality of permanent magnets of the magnetic chuck a mask to the substrate disposed on the substrate carrier. A layer can then be deposited through the mask onto the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a permanent magnetic mask chuck and methods for using the same. The permanent magnetic mask chuck can be integrated into a process chamber or a substrate carrier for use in a process chamber. By incorporating a series of permanent magnets, the mask can be chucked in position over the substrate in a controlled fashion.

FIGS. 1A to 1D show an evaporation source 100 in various positions in a vacuum chamber 110 with respect to a first mask 132a and a second mask 132b, according to embodiments described herein. The movement of the evaporation source 100 between the different positions is indicated by arrows 101B, 101C, and 101D. FIGS. 1A to 1D show the evaporation source 100 having an evaporation crucible 104 and the distribution pipe 106. The distribution pipe 106 is supported by the support 102. Further, according to some embodiments, the evaporation crucible 104 can also be supported by the support 102. The substrates, e.g., a first substrate 121a and a second substrate 121b, are provided in the vacuum chamber 110. The first substrate 121a and the second substrate 121b are supported and chucked by a respective substrate carrier, e.g. a first substrate carrier 150a and a second substrate carrier 150b, described in more detail with reference to FIG. 3 below. The first mask 132a and second mask 132b are provided between the substrate 121 and the evaporation source 100. The first mask 132a and second mask 132b are chucked by a respective mask chucking assembly, e.g. a first mask chucking assembly 151a and a second mask chucking assembly 151b, described in more detail with reference to FIG. 4A to 4E below. As illustrated in FIGS. 1A to 1D, organic material is evaporated from the distribution pipe 106 to deposit a layer on the substrates. The first mask 132a and the second mask 132b mask the substrate during the layer deposition. This is indicated by reference numeral 10.

Figure 1A:
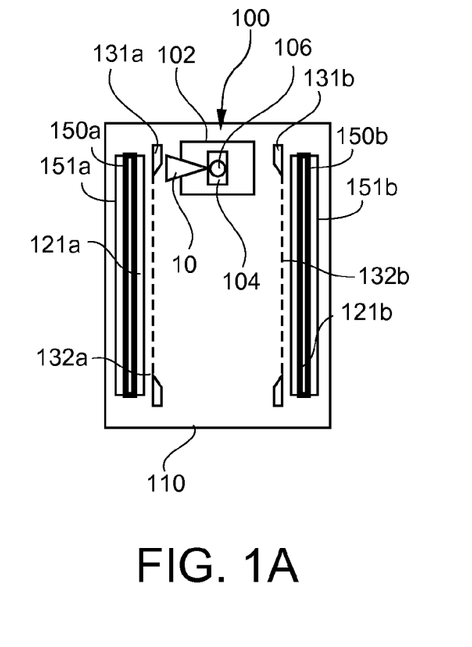
FIGS. 1A to 1D show schematic views illustrating an evaporation source for organic material in use with a magnetic chucking assembly, according to embodiments described herein.
Figure 1B:
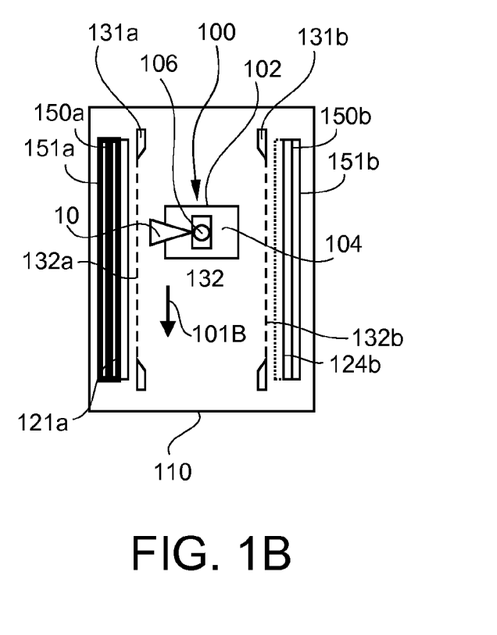
Figure 1C:
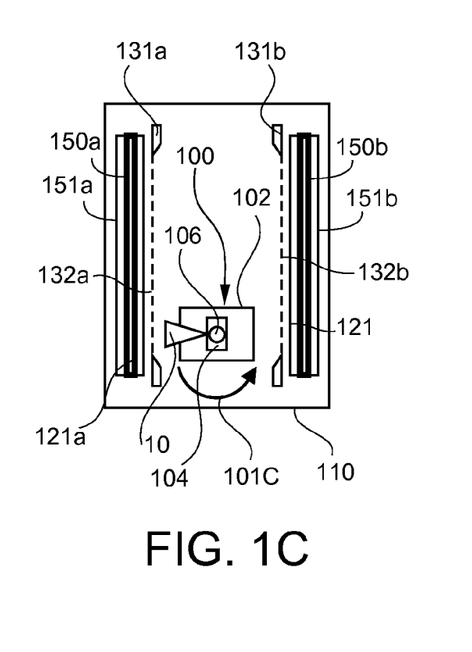

In FIG. 1A, the evaporation source 100 is shown in the first position with the first substrate carrier 150a and the second substrate carrier being active. As shown in FIG. 1B, the first chucking assembly 150a has the first substrate 121a chucked in position. The first mask 132a, shown positioned over the first substrate 121a, is chucked into position by the first mask chucking assembly 151a over the appropriate portion of the first substrate 121a. With the first mask 132a in position, the first substrate 121a in the vacuum chamber 110 is deposited with a layer of organic material by a translational movement of the evaporation source as indicated by arrow 101B. While the first substrate 121a is deposited with the layer of organic material through the first mask 132a, a second substrate 121b, e.g. the substrate on the right-hand side in FIGS. 1A to 1D, can be exchanged. FIG. 1B shows a second transportation track 124b for the second substrate 121b. As the second substrate 121b is not in position in FIG. 1B, the second substrate carrier 150b and the second mask chucking assembly 151b are not activated for chucking. After the first substrate 121a has been deposited with the layer of organic material, the distribution pipe 106 of the evaporation source 100 is rotated as indicated by arrow 101C in FIG. 1C.

Figure 1D:
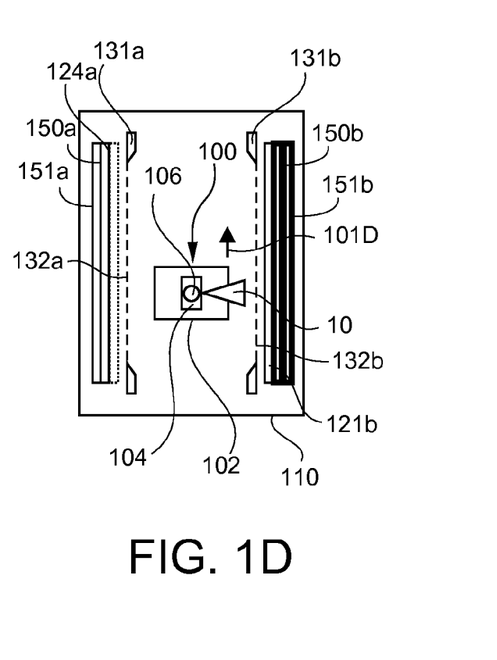

During deposition of the organic material on the first substrate 121a, the second substrate 121b is then chucked to the second substrate carrier 150b. The second mask 132b is the positioned and aligned with relation to the second substrate followed by chucking the second mask 132b to the second mask chucking assembly 151b over the second substrate 121b. Accordingly, after the rotation shown in FIG. 1C, the second substrate 121b can be coated with a layer of organic material through the second mask 132b as indicated by arrow 101D. While the second substrate 121b is coated with the organic material, the first mask 132a can be unchucked from the first mask chucking assembly 151a. With the first mask 132a being unchucked, the first substrate 121a can then be removed from the chamber for unchucking from the first chucking assembly 150a. FIG. 1D shows a first transportation track 124a in the position of the first substrate 121a.

According to embodiments described herein, the first substrate 121a and second substrate 121b are coated with organic material in a substantially vertical position. That is, the views shown in FIGS. 1A to 1D are top views of an apparatus including the evaporation source 100. The distribution pipe can be a vapor distribution showerhead, particularly a linear vapor distribution showerhead. Thereby, the distribution pipe provides a line source extending essentially vertically. According to embodiments described herein, which can be combined with other embodiments described herein, essentially vertically is understood particularly when referring to the substrate orientation, to allow for a deviation from the vertical direction of 10° or below. This deviation can be provided because a substrate carrier with some deviation from the vertical orientation might result in a more stable substrate position. Yet, the substrate orientation during deposition of the organic material is considered essentially vertical, which is considered different from the horizontal substrate orientation. The surface of the substrates is thereby coated by a line source extending in one direction corresponding to one substrate dimension and a translational movement along the other direction corresponding to the other substrate dimension. Moreover, though described in reference to a vertical position for an exemplary vertical process chamber, this configuration and/or chamber is not intended to be limiting. Embodiments described herein are equally amenable to horizontal chambers or chambers which can process more or fewer substrates.

Embodiments described herein particularly relate to deposition of organic materials, e.g. for OLED display manufacturing and on large area substrates. According to some embodiments, large area substrates or carriers supporting one or more substrates, i.e. large area carriers, may have a size of at least 0.174 m$^2$. The size of the carrier can be about 1.4 m$^2$ to about 8 m$^2$, such as about 2 m$^2$ to about 9 m$^2$ or even up to 12 m$^2$. The rectangular area, in which the substrates are supported, for which the holding arrangements, apparatuses, and methods according to embodiments described herein are provided, can be carriers having sizes for large area substrates as described herein. For instance, a large area carrier, which would correspond to an area of a single large area substrate, can be GEN 5, which corresponds to about 1.4 m$^2$ substrates (1.1 m×1.3 m), GEN 7.5, which corresponds to about 4.29 m$^2$ substrates (1.95 m×2.2 m), GEN 8.5, which corresponds to about 5.7 m$^2$ substrates (2.2 m×2.5 m), or even GEN 10, which corresponds to about 8.7 m$^2$ substrates (2.85 m×3.05 m). Even larger generations such as GEN 11 and GEN 12 and corresponding substrate areas can similarly be implemented. According to typical embodiments, which can be combined with other embodiments described herein, the substrate thickness can be from 0.1 to 1.8 mm and the holding arrangement, and particularly the holding devices, can be adapted for such substrate thicknesses. However, particularly the substrate thickness can be about 0.9 mm or below, such as 0.5 mm or 0.3 mm, and the holding arrangement, and particularly the holding devices, are adapted for such substrate thicknesses. The substrate may be made from any material suitable for material deposition. For instance, the substrate may be made from a material selected from the group consisting of glass (for instance soda-lime glass, borosilicate glass etc.), metal, polymer, ceramic, compound materials, carbon fiber materials or any other material or combination of materials which can be coated by a deposition process.

According to embodiments described herein, the first mask chucking assembly 151a and the second mask chucking assembly 151b employ permanent magnets to allow independent chucking and unchucking of the masks, e.g. the first mask 132a and the second mask 132b, without affecting the chucking of the respective substrates, e.g. the first substrate 121a and the second substrate 121b. Further, the mask chucking assemblies according to embodiments described herein can minimize and reduce the force of contact between the substrate and the mask during OLED display manufacturing. The first mask chucking assembly 151a and the second mask chucking assembly 151b can be integrated into the process chamber or with the substrate carrier. Embodiments which can be integrated into the process chamber include the embodiments described with reference to FIGS. 4A-4D. Embodiments which can be integrated with the substrate carrier include the embodiments described with reference to FIG. 4E.

Figure 2:
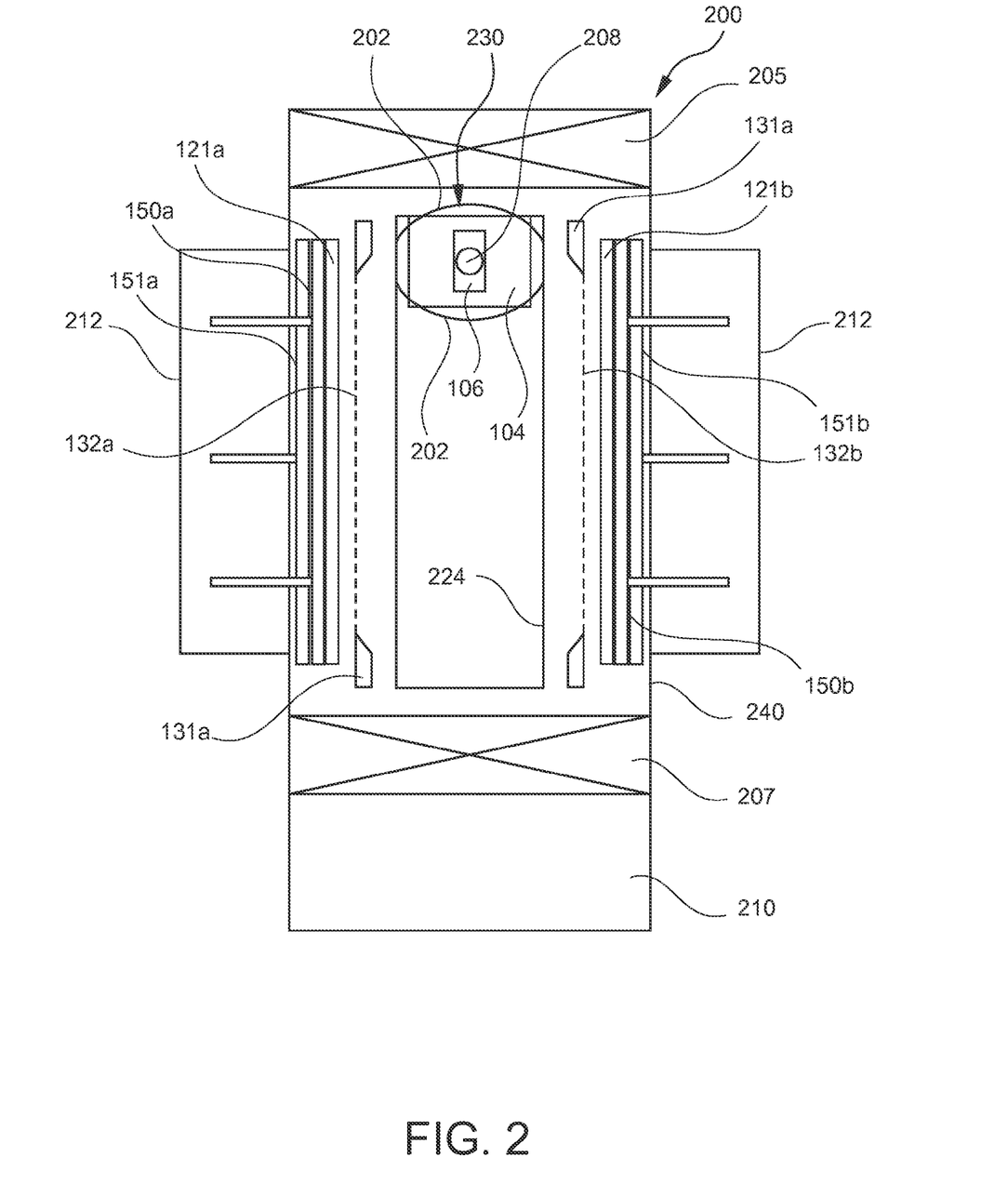
FIG. 2 shows a schematic top view of a deposition apparatus with a magnetic chucking assembly according to embodiments described herein.

FIG. 2 illustrates an embodiment of a deposition apparatus 200 for depositing organic material in a vacuum chamber 240 including the substrate carrier 150a and 150b and the mask chucking assembly 151a and 151b, according to one embodiment. The evaporation source 230 is provided in the vacuum chamber 240 on a track or linear guide 224. The linear guide 224 is configured for the translational movement of the evaporation source 230. Thereby, according to different embodiments, which can be combined with other embodiments described herein, a drive for the translational movement can be provided in the evaporation source 230, at the track or linear guide 224, within the vacuum chamber 240 or a combination thereof. FIG. 2 shows a valve 205, for example a gate valve. The valve 205 allows for a vacuum seal to an adjacent vacuum chamber (not shown in FIG. 2). The valve can be opened for transport of a plurality of substrates, shown here as substrates 121a and 121b, or one or more masks for the plurality of substrates, shown here as masks 132a and 132b, into the vacuum chamber 240 or out of the vacuum chamber 240.

According to some embodiments, which can be combined with other embodiments described herein, a further vacuum chamber, such as maintenance vacuum chamber 210 is provided adjacent to the vacuum chamber 240. Thereby the vacuum chamber 240 and the maintenance vacuum chamber 210 are connected with a valve 207. The valve 207 is configured for opening and closing a vacuum seal between the vacuum chamber 240 and the maintenance vacuum chamber 210. The evaporation source 230 can be transferred to the maintenance vacuum chamber 210 while the valve 207 is in an open state. Thereafter, the valve can be closed to provide a vacuum seal between the vacuum chamber 240 and the maintenance vacuum chamber 210. If the valve 207 is closed, the maintenance vacuum chamber 210 can be vented and opened for maintenance of the evaporation source 230 without breaking the vacuum in the vacuum chamber 240.

Two substrates 121a and 121b can be supported on respective transportation tracks within the vacuum chamber 240. Further, two tracks for providing masks 132a and 132b thereon can be provided. Thereby, coating of the substrates 121a and 121b can be masked by respective masks 132a and 132b. According to typical embodiments, the masks 132a and 132b are provided in a mask frame 131a and 131b to hold the masks 132a and 132b in a predetermined position. The masks 132a and 132b are chucked into position over the substrate 121a and 121b using the chucking assembly 150a and 150b. The chucking assembly 150a and 150b can act independently to chuck the substrate 121a and 121b and the masks 132a and 132b, such that the masks 132a and 132b can be positioned over the substrate 121a and 121b without affecting the positioning of the substrate 121a and 121b and without mechanical control of the masks 132a and 132b.

According to some embodiments, which can be combined with other embodiments described herein, a substrate 121a and 121b can be supported by a substrate chucking assemblies 150a and 150b, which are connected to respective alignment units 212a and 212b. The alignment units 212a and 212b can adjust the position of the substrate 121a and 121b with respect to the masks 132a and 132b. FIG. 2 illustrates an embodiment where the substrate chucking assemblies 150a and 150b are connected to the alignment unit 212. Accordingly, the substrate 121a and 121b are moved relative to the masks 132a and 132b in order to provide for a proper alignment between the substrate 121a and 121b and the masks 132a and 132b during deposition of the organic material. According to a further embodiment, which can be combined with other embodiments described herein, alternatively or additionally the masks 132a and 132b and/or the mask frame 131a and 131b holding the masks 132a and 132b can be connected to the alignment unit 212. Thereby, either the masks 132a and 132b can be positioned relative to the substrate 121a and 121b or the masks 132a and 132b and the substrate 121a and 121b can both be positioned relative to each other. The alignment units 212, which are configured for adjusting the relative position between a substrate 121a and 121b and masks 132a and 132b relative to each other, allow for a proper alignment of the masking during the deposition process, which is beneficial for high quality or LED display manufacturing.

Examples of an alignment of a mask and a substrate relative to each other include alignment units, which allow for a relative alignment in at least two directions defining a plane, which is essentially parallel to the plane of the substrate and the plane of the mask. For example, an alignment can at least be conducted in an x-direction and a y-direction, i.e. two Cartesian directions defining the above-described parallel plane. The mask and the substrate can be essentially parallel to each other. Specifically, the alignment can further be conducted in a direction essentially perpendicular to the plane of the substrate and the plane of the mask. Thus, an alignment unit is configured at least for an X-Y-alignment, and specifically for an X-Y-Z-alignment of the mask and the substrate relative to each other. One specific example, which can be combined with other embodiments described herein, is to align the substrate in x-direction, y-direction and z-direction to a mask, which can be held stationary in the vacuum chamber 240.

As shown in FIG. 2, the linear guide 224 provides a direction of the translational movement of the evaporation source 230. On both sides of the evaporation source 230 and masks 132a and 132b are provided. The masks 132a and 132b can thereby extend essentially parallel to the direction of the translational movement. Further, the substrates 121a and 121b at the opposing sides of the evaporation source 230 can also extend essentially parallel to the direction of the translational movement. According to typical embodiments, a substrate 121a and 121b can be moved into the vacuum chamber 240 and out of the vacuum chamber 240 through valve 205. Thereby, and deposition apparatus 200 can include a respective transportation track for transportation of each of the substrates 121a and 121b. For example, the transportation track can extend parallel to the substrate position shown in FIG. 2 and into and out of the vacuum chamber 240.

Typically, further tracks are provided for supporting the mask frames 131a and 131b and thereby the masks 132a and 132b. Accordingly, some embodiments, which can be combined with other embodiments described herein, can include four tracks within the vacuum chamber 240. In order to move one of the masks 132a and 132b out of the chamber, for example for cleaning of the mask, the mask frame 131a and 131b and, thereby, the mask can be moved onto the transportation track of the substrate 121a and 121b. The respective mask frame can then exit or enter the vacuum chamber 240 on the transportation track for the substrate. Even though it would be possible to provide a separate transportation track into and out of the vacuum chamber 240 for the mask frames 131a and 131b, the costs of ownership of a deposition apparatus 200 can be reduced if only two tracks, i.e. transportation tracks for a substrate, extend into and out of the vacuum chamber 240 and, in addition, the mask frames 131a and 131b can be moved onto a respective one of the transportation tracks for the substrate by an appropriate actuator or robot.

Once the masks 132a and 132b and the substrate 121a and 121b are positioned in alignment with one another, the chucking assembly 150a and 150b can bring the masks 132a and 132b into close proximity to the substrate 121a and 121b. During the deposition process, an organic material is being propelled at the substrate 121a and 121b from the evaporation source 230. This organic material is deposited through formations in the masks 132a and 132b, onto the substrate 121a and 121b. The formations provide the subsequent shape of the deposited material on the substrate 121a and 121b. If the masks 132a and 132b are positioned too far from the substrate 121a and 121b, the organic material will be deposited imprecisely through the formations in the masks 132a and 132b leading to poor resolution or failure of the final product. If the masks 132a and 132b make too much contact or uncontrolled contact with the substrate 121a and 121b, the masks 132a and 132b can cause physical damage to the substrate 121a and 121b. This proximity damage can be exacerbated by multiple alignment processes between the substrate 121a and 121b and the masks 132a and 132b. By using the chucking assembly 150a and 150b as described herein, the three dimensional position of the mask can be more finely controlled allowing for better deposition with minimal risk of substrate damage during processing.

FIG. 2 illustrates another exemplary embodiment of the evaporation source 230. The evaporation source 230 includes a support 104. The support 104 is configured for the translational movement along the linear guide 224. The support 104 supports an evaporation crucible 106 and a distribution pipe 208 provided over the evaporation crucible 106. Thereby, the vapor generated in the evaporation crucible can move upwardly and out of the one or more outlets of the distribution pipe. According to embodiments described herein, the distribution pipe 208 can also be considered a vapor distribution showerhead, for example a linear vapor distribution showerhead.

FIG. 2 further illustrates a shield assembly having at least one shield 202. Typically, as shown in FIG. 2, embodiments can include two shields 202, e.g. side shields. Thereby, an evaporation of the organic material can be delimited in the direction towards the substrate. An evaporation sideward relative to the distribution pipe, i.e. in a direction that is for example perpendicular to the normal evaporation direction, can be avoided or used in an idle mode only. In light of the fact that it can be easier to block the vapor beam of organic material as compared to switching off the vapor beam of organic material, the distribution pipe 208 may also be rotated towards one of the side shields 202 in order to avoid vapor exiting the evaporation source 230 during an operation mode where vapor emission is not desired.

Figure 3:
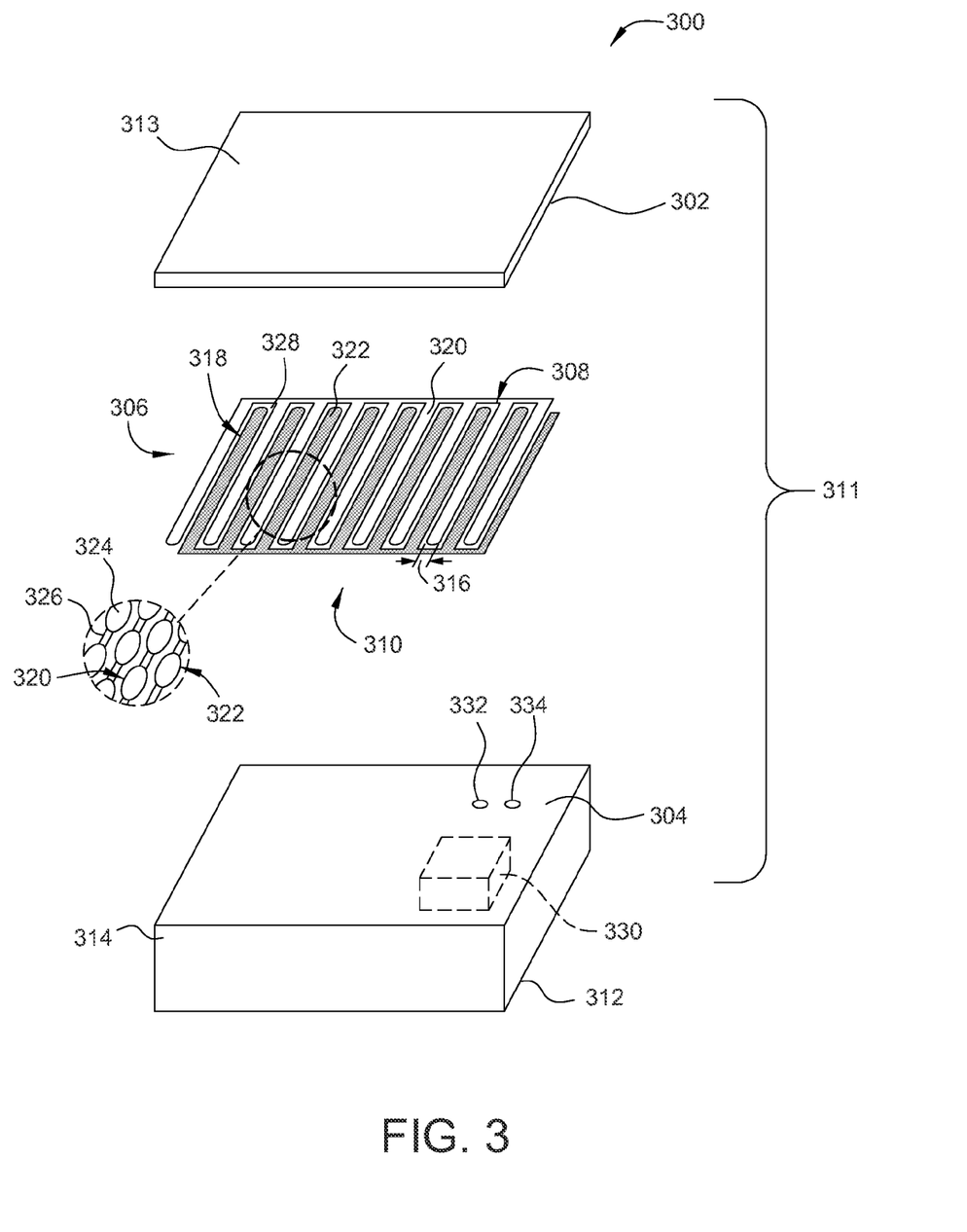
FIG. 3 depicts an exploded view of one embodiment of a substrate carrier with integrated electrostatic chuck according to an embodiment.

FIG. 3 depicts an exploded view of one embodiment of the substrate carrier 300. The substrate carrier 300 can be a component of the substrate carrier 150a and 150b. The substrate carrier 300 includes a rigid support base 304, an electrode assembly 306 disposed on the rigid support base 304, and an encapsulating member 302 disposed on the electrode assembly 306, which together form the body 311 of the substrate carrier 300. The rigid support base 304 defines the bottom surface 312 of the substrate carrier 300 while the encapsulating member 302 defines the substrate supporting surface 313 of the substrate carrier 300. Although not shown, the body 311 may include lift pin holes extending there through.

In the embodiment of FIG. 3, the rigid support base 304 has a rectangular-like shape having a periphery (defined by the sides 314) that substantially matches the shape and size of electrode assembly 306 and encapsulating member 302 to allow the substrates 121a and 121b have a similar shape and size to be secured thereto. It is noted that the rigid support base 304, the electrode assembly 306 and the encapsulating member 302 may have an alternative shape or geometry selected as needed to accommodate the geometry of a workpiece, such as the substrates 121a and 121b. For example, although the substrate carrier 300 is shown with a rectangular aerial extent, it is contemplated that the aerial extent of the substrate carrier 300 may alternatively have other geometric forms to accommodate different substrates, such as circular geometric forms to accommodate a circular substrate.

In one embodiment, the rigid support base 304 may be fabricated from an insulating material, such as a dielectric material or a ceramic material. Suitable examples of the ceramic materials or dielectric materials include polymers (i.e., polyimide), silicon oxide, such as quartz or glass, aluminum oxide ($Al_2O_3$), aluminum nitride (AlN), yttrium containing materials, yttrium oxide ($Y_2O_3$), yttrium-aluminum-garnet (YAG), titanium oxide (TiO), titanium nitride (TiN), silicon carbide (SiC) and the like. Optionally, the rigid support base 304 may be a metal or metallic body having a dielectric layer disposed on the surface of the rigid support base 304 facing the electrode assembly 306.

The electrode assembly 306 is disposed on the rigid support base 304 and includes at least two distributed electrodes 308, 310. Each electrode 308, 310 may be charged with different polarities when a chucking voltage is applied thereto, thus generating an electrostatic force. The electrodes 308, 310 are configured to distribute the electrostatic force along a distance at least two times with width of the substrate carrier 300. Each electrode 308, 310 may have a plurality of geometric forms interleaved or interposed among a plurality of geometric forms of the other electrode. As shown in FIG. 3, a plurality of electrode fingers 320 comprising electrode 308 are interleaved with plurality of electrode fingers 322 comprising electrode 310. It is believed that the interleaved fingers 320, 322 of the distributed electrodes 308, 310 provides local electrostatic attraction distributed across a large area of the substrate carrier 300 which in the aggregation provides a high chucking force while using less chucking power. The electrode fingers 320, 322 may be formed to have different shapes, lengths and geometry. In one example, one or both of the electrode fingers 320, 322 may be formed from interconnected electrode islands 324. Interconnections 326 between electrode islands 324 may be in the plane of the electrodes 308, 310 as shown in FIG. 3, or out of plane, such as in the form of jumpers and/or vias. In one embodiment, the electrode finger 320, 322 has a width 316 of between about 0.25 mm and about 10 mm.

In one embodiment, the electrode assembly 306 may be fabricated from a metallic material, such as aluminum silicon alloy, having a coefficient of thermal expansion similar to the adjacent encapsulating member 302 and the rigid support base 304. In one embodiment, the coefficient of thermal expansion of the electrode assembly 306 is between about 4 $\mu m/(m*K)$ and about 6 $\mu m/(m*K)$, and is generally within 20 percent of the coefficient of thermal expansion of the encapsulating member 302.

Between each of the electrode fingers 320 of the first electrode 308, spaces 328 are defined to receive electrode fingers 322 of the second electrode 310. The spaces 328 may be an air gap, filled with a dielectric spacer material, or filled with at least one of the rigid support base 304 or encapsulating member 302.

Vias 332, 334 may be formed through the rigid support base 304 to couple the first and the second electrodes 308, 310 to the chucking power source (not shown). In some embodiment, an optional battery 330 may be disposed in the rigid support base 304 and connected to the first and the second electrodes 308, 310 by the vias 332, 334 to provide power for chucking the substrates 121a and 121b. The battery 330 may be a lithium ion battery and may have terminal connections (not shown) on the exterior of the rigid support base 304 for recharging the battery 330 without removal from the rigid support base 304.

The encapsulating member 302 is disposed on the rigid support base 304 sandwiching the electrode assembly 306, to form the body 311 of the substrate carrier 300 as a unitary structure. The encapsulating member 302 is positioned on the electrode assembly 306 to provide an insulating surface on which the substrates 121a and 121b are chucked. The encapsulating member 302 may be fabricated from a material having thermal properties, e.g., coefficient of thermal expansion, substantially matching that of the underlying electrode assembly 306. In some embodiments, the material utilized to fabricate the encapsulating member 302 is also utilized to fabricate the rigid support base 304.

After the encapsulating member 302, the electrode assembly 306 and the rigid support base 304 are stacked together, a bonding process, such as an annealing process, is performed to fuse the encapsulating member 302, the electrode assembly 306 and the rigid support base 304 together, forming a laminated structure comprising the body 311 of the substrate carrier 300. As the encapsulating member 302, the electrode assembly 306 and the rigid support base 304 may be required to operate in a high temperature environment, e.g., greater than 300 degrees Celsius, the materials utilized to fabricate these three components may be selected from heat resistance materials, such as ceramic materials or glass materials, that can sustain high thermal treatment during the annealing process. In one embodiment, the encapsulating member 302 and the rigid support base 304 may be fabricated from a ceramic material, a glass material, or a composite of ceramic and metal material, providing good strength and durability as well as good heat transfer properties. The materials selected to fabricate the encapsulating member 302 and the rigid support base 304 may have a coefficient of thermal expansion that is substantially matched to the intermediate electrode assembly 306 to reduce thermal expansion mismatch, which may cause stress or failure under high thermal loads. In one embodiment, the coefficient of thermal expansion of the encapsulating member 302 is between about 2 $\mu m/(m*K)$ and about 8 $\mu m/(m*K)$. Ceramic materials suitable for fabricating the encapsulating member 302 and the rigid support base 304 may include, but not limited to, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). In another embodiment, the encapsulating member 302 and the rigid support base 304 may be fabricated from a composite material includes a different composition of a ceramic and metal, such as metal having dispersed ceramic particles.

During operation, a charge may be applied to the first electrode 308 and an opposite charge may be applied to the second electrode 310 to generate an electrostatic force. During chucking, the electrostatic force generated by the electrodes 308, 310 securely holds the substrates 121a and 121b to the substrate supporting surface 313 of the encapsulating member 302. As the power supplied from the chucking power source is turned off, the charges present at the interface 318 between the electrodes 308, 310 may be maintained over a long period of time, thus allowing the substrates 121a and 121b to remain chucked to the substrate carrier 300 after power has been removed. To release the substrate held on the substrate carrier 300, a short pulse of power in the opposite polarity is provided to the electrodes 308, 310 to remove the charge present in the interface 318.

Figure 4A:
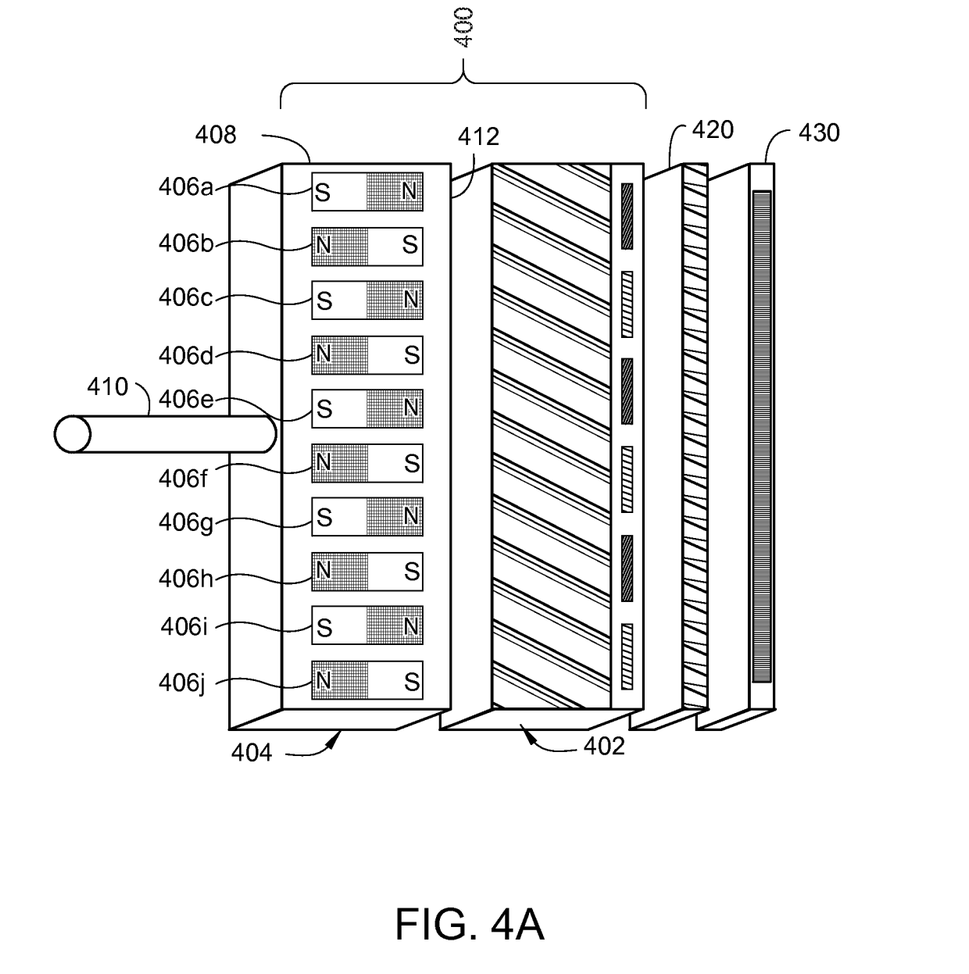
FIG. 4A depicts a chucking assembly with a permanent magnetic mask chuck, according to an embodiment.

FIG. 4A depicts a chucking assembly 400, according to one embodiment. The chucking assembly 400 includes a substrate carrier 402 and a permanent magnetic mask chuck 404. The substrate carrier 402 can be configured to adhere and release a substrate 420. In one embodiment, the substrate carrier 402 is substantially similar to the substrate carrier 300, described with reference to FIG. 3.

The permanent magnetic mask chuck 404 includes a plurality of permanent magnets, depicted here as permanent magnets 406a-406j, contained within a chuck body 408. The chuck body 408 can completely surround the permanent magnets 406a-406j. The chuck body 408 can further have a moveable connection 410 and a contact surface 412. The moveable connection 410 can apply a force to the chuck body 408 to move the permanent magnetic mask chuck 404 closer to the substrate carrier 402. The contact surface 412 is the surface which will meet the substrate carrier 402. The contact surface 412 can be a flat surface, as depicted in FIG. 4A.

In one embodiment, the chuck body 408 is fabricated from an insulating material, such as a dielectric material or a ceramic material. Suitable examples of the ceramic materials or dielectric materials include polymers (i.e., polyimide), silicon oxide, such as quartz or glass, aluminum oxide ($Al_2O_3$), aluminum nitride (AlN), yttrium containing materials, yttrium oxide ($Y_2O_3$), yttrium-aluminum-garnet (YAG), titanium oxide (TiO), titanium nitride (TiN), silicon carbide (SiC) and the like. Optionally, the chuck body 408 may be a metal or metallic body. The chuck body 408 may be a ferromagnetic, ferromagnetic or non-magnetic body.

The permanent magnets 406a-406j can be composed of a ferromagnetic material, such as aluminum-nickel-cobalt (Alnico), Ceramic, Rare-Earth, Iron-Chromium-Cobalt or combinations thereof. In one embodiment, the permanent magnets are composed of Alnico. The permanent magnets 406a-406j can be positioned such that the polarity alternates from one magnet to the next. Shown here, the north pole of permanent magnets 406a, 406c, 406e, 406g and 406i and the south pole of permanent magnets 406b, 406d, 406f, 406h and 406j are directed towards the substrate carrier 402.

In operation, the substrate 420 can be chucked to the substrate carrier 402 using an electromagnetic force as described above. A mask 430 is positioned above and aligned with the substrate 420. The permanent magnetic mask chuck 404 is then brought into magnetic connection with the mask 430. The permanent magnetic mask chuck 404 can be repositioned with relation to the process chamber and in proximity of the substrate carrier 402 in embodiments where the permanent magnetic mask chuck 404 is integrated with the process chamber. The magnets of the permanent magnetic mask chuck 404 can be repositioned in the chuck body 408 in embodiments where the permanent magnetic mask chuck 404 is integrated with the substrate carrier 402. In either embodiment, the position of the magnets in proximity with the mask 430 allows the delivery of the magnetic field from the magnets to the mask 430. Magnetic connection is described as a position where the magnetic field affects the described material, e.g. the mask 430. The magnetic force from the permanent magnets 406a-406j in the permanent magnetic mask chuck 404 brings at least a portion of the mask 430 into position over or in contact with the substrate 420. A layer (not shown) is then deposited through the mask 430 on the substrate 420. Once the layer is deposited, the permanent magnetic mask chuck 404 is positioned such that the magnetic field is no longer affects the position of the mask 430.

The permanent magnetic mask chuck 404 is depicted here as a rectangular shape. However, the permanent magnetic mask chuck 404 can be of any shape such that it can deliver the magnetic field of the permanent magnets 406a-406j to the mask 430.

FIGS. 4B-4E depict further embodiments of a permanent magnetic mask chuck useable with a chucking assembly, according to embodiments described herein. The magnetic field strength delivered to an object is based on the strength of the magnetic field and is inversely proportional to approximately the cube of the distance from that object. Thus, in the embodiments below, the position of the magnet, the size of the magnet and combinations thereof are applied to control the magnetic field strength applied to different portions of the mask 430.

Figure 4B:
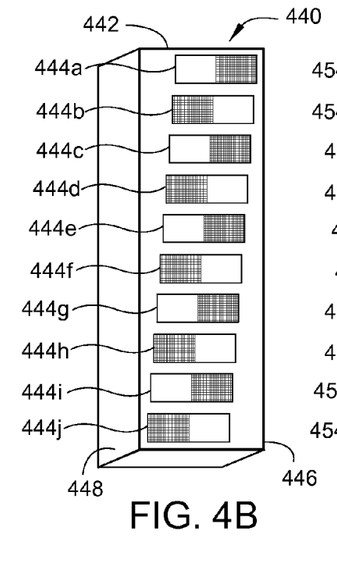
FIGS. 4B to 4E depict permanent magnetic mask chuck, according to embodiments described herein.

FIG. 4B depicts a permanent magnetic mask chuck 440 with a skewed magnet position according to an embodiment. The permanent magnetic mask chuck 440 has a chuck body 442. The chuck body 442 can be composed of similar materials to those described with reference to FIG. 4A. Positioned in the chuck body 442 are a plurality of permanent magnets, shown here as permanent magnets 444a-444j. The permanent magnets 444a-444j are positioned such that a first magnet, e.g. permanent magnet 444a, is a first distance from a first edge 446. Each subsequent magnet, e.g. permanent magnet 444b-444j, is positioned further away from the first edge 446 and approaching closer to a second edge 448.

In operation, the mask 430 is positioned above and aligned with the substrate 420 as described with reference to FIG. 4A. The permanent magnetic mask chuck 440 is then brought into magnetic connection with the mask 430. The permanent magnetic mask chuck 440 can be repositioned as described with reference to FIG. 4A when integrated with the process chamber or when integrated with the substrate carrier 402. The magnetic force from the permanent magnets 444a-444j in the permanent magnetic mask chuck 440 sequentially brings at least a portion of the mask 430 into position over or in contact with the substrate 420. Sequential as used here is with relation to the magnet closest the mask 430 (permanent magnet 444a) and each subsequent magnet in sequence. Though shown in a particular distance from the first edge 446 and order, this distance and order of permanent magnets 444a-444j is not necessary. The permanent magnets 444a-444j may be in any order, at any distance from the first edge 446, including other orientations and quantities of permanents magnets.

This design is believed to have a protective effect on the substrate 420, reducing the force of contact with the mask 430. As the magnetic field strength is a function of the distance of the magnet from the mask 430, the permanent magnets 444a-444j are positioned to sequentially apply the magnetic field from a first side to a second side. Thus, permanent magnet 444a will apply a greater magnetic field strength on the mask 430 than each subsequent permanent magnet, allowing for a more gradual overall connection.

Figure 4C:
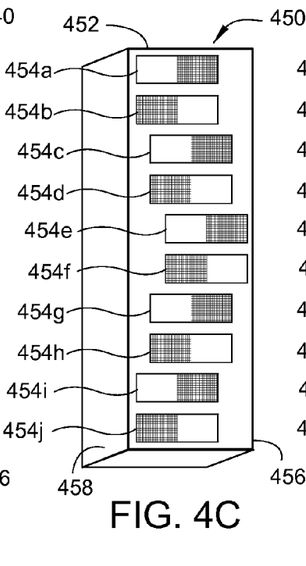

FIG. 4C depicts a permanent magnetic mask chuck 450 with a center skewed magnet position, according to an embodiment. The permanent magnetic mask chuck 450 has a chuck body 452. The chuck body 452 can be composed of similar materials to those described with reference to FIG. 4A. Positioned in the chuck body 452 are a plurality of permanent magnets, shown here as permanent magnets 454a-454j.

The permanent magnets 454a-454j are positioned such that a first tier of central magnets, e.g. permanent magnet 454e-454f, is a first distance from a first edge 456. The permanent magnets 454a-454j are subsequently tiered out such that each subsequent tier from the first tier, e.g. permanent magnets 454d and 454g, permanent magnets 454c and 454h, permanent magnets 454b and 454i and permanent magnets 454a and 454j respectively, is positioned further away from the first edge 446 and approaching closer to a second edge 458.

In operation, the mask 430 is positioned above and aligned with the substrate 420 as described with reference to FIG. 4A. The permanent magnetic mask chuck 450 is then brought into magnetic connection with the mask 430. The permanent magnetic mask chuck 450 can be repositioned as described with reference to FIG. 4A when integrated with the process chamber or when integrated with the substrate carrier 402. The magnetic force from the permanent magnets 454a-454j in the permanent magnetic mask chuck 450 brings at least a portion of the mask 430 into position over or in contact with the substrate 420. The mask 430 enters the magnetic field of the permanent magnets 454a-454j in a center out sequential fashion.

This design is believed to have a protective effect on the substrate 420, spreading the force of contact with the mask 430 over a larger area. As above, the magnetic field strength is a function of the distance of the magnet from the mask 430, the permanent magnets 454a-454j are positioned to sequentially apply the magnetic field from the center out. Thus, the strength of the magnetic field applied to the mask 430 will gradually increase as the permanent magnets 454a-

454*j* sequentially enter range to apply their field to the mask. This spread of magnetic field will allow for a more gradual overall connection.

Figure 4D:
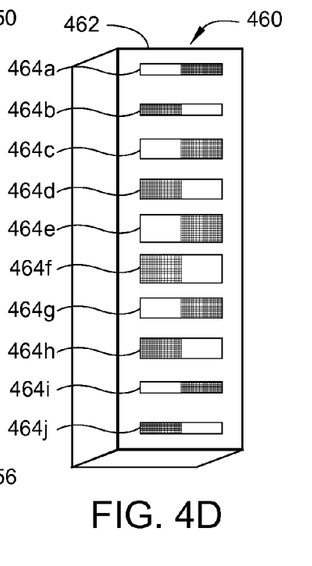

FIG. 4D depicts a permanent magnetic mask chuck 460 with progressively reduced magnet size, according to an embodiment. The permanent magnetic mask chuck 460 has a chuck body 462. The chuck body 462 can be composed of similar materials to those described with reference to FIG. 4A. Positioned in the chuck body 462 are a plurality of permanent magnets, shown here as permanent magnets 464*a*-464*j*.

The permanent magnets 464*a*-464*j* are positioned such that a first tier of central magnets, e.g. permanent magnet 464*e*-464*f*, is a first size. The permanent magnets 464*a*-464*j* are subsequently tiered out such that each subsequent tier from the first tier, e.g. permanent magnets 464*d* and 464*g*, permanent magnets 464*c* and 464*h*, permanent magnets 464*b* and 464*i* and permanent magnets 464*a* and 464*j* respectively, is reduced in size or magnetic field production capability.

In operation, the mask 430 is positioned above and aligned with the substrate 420 as described with reference to FIG. 4A. The permanent magnetic mask chuck 460 is then brought into magnetic connection with the mask 430. The permanent magnetic mask chuck 460 can be repositioned as described with reference to FIG. 4A when integrated with the process chamber or when integrated with the substrate carrier 402. The magnetic force from the permanent magnets 464*a*-464*j* in the permanent magnetic mask chuck 460 brings at least a portion of the mask 430 into position over or in contact with the substrate 420. The mask 430 enters the magnetic field of the permanent magnets 464*a*-464*j* simultaneously with the exterior magnets producing a weaker field than the interior magnets.

This design is believed to have a protective effect on the substrate 420, spreading the force of contact with the mask 430 over a larger area. As above, the magnetic field strength is a function of the distance of the magnet from the mask 430. The permanent magnets 464*a*-464*j* are sized to sequentially apply the magnetic field from the center out. Thus, the strength of the magnetic field applied to the mask 430 will gradually increase as the permanent magnets 464*a*-464*j* sequentially enter range to apply their field to the mask 430. This spread of magnetic field will allow for a more gradual overall connection.

Figure 4E:
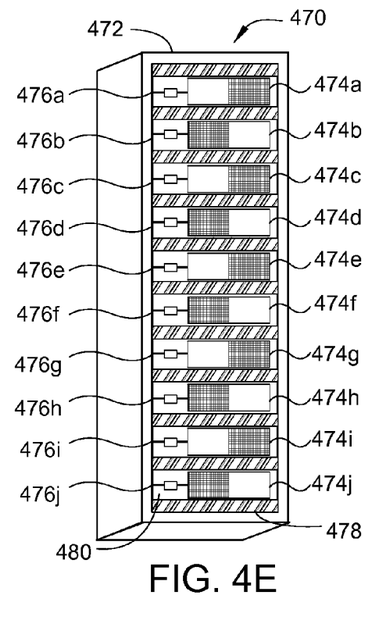

FIG. 4E depicts a permanent magnetic mask chuck 460 with internally adjustable magnets, according to an embodiment. The permanent magnetic mask chuck 470 has a chuck body 472. The chuck body 472 can be composed of similar materials to those described with reference to FIG. 4A. Positioned in the chuck body 472 are a plurality of permanent magnets, shown here as permanent magnets 474*a*-474*j*. The chuck body 472 has an internal space 480. The internal space 480 is large enough to contain at least the permanent magnets 474*a*-474*j*. The internal space 480 is subdivided using a plurality of dividers 478 to create individual spaces for the permanent magnets 474*a*-474*j*. A plurality of actuators 476*a*-476*j* are connected with the permanent magnets 474*a*-474*j*.

The permanent magnets 474*a*-474*j* can be positioned in a variety of positions such that the magnetic field can be delivered in any order desired. Further, the positioning of the permanent magnets 474*a*-474*j* can be changed in real time. As such, the permanent magnets 474*a*-474*j* can be repositioned during an operation or after an operation to assist with chucking and dechucking of the mask 430.

In operation, the mask 430 is positioned above and aligned with the substrate 420 as described with reference to FIG. 4A. The permanent magnetic mask chuck 470 can then be brought into magnetic connection with the mask 430. The permanent magnetic mask chuck 470 can be repositioned as described with reference to FIG. 4A when integrated with the process chamber or when integrated with the substrate carrier 402. The magnetic force from the permanent magnets 474*a*-474*j* in the permanent magnetic mask chuck 470 brings at least a portion of the mask 430 into position over or in contact with the substrate 420. The mask 430 enters the magnetic field of the permanent magnets 474*a*-474*j* in an order and with an intensity dependent on the chosen position of the permanent magnets 474*a*-474*j*.

Thus, the position and size of the permanent magnets employed in the permanent magnetic mask chuck creates a magnetic field to move the mask into position over the substrate for a deposition process. By controlling the size and proximity of the permanent magnets, the magnetic field can be applied to safely and securely to chuck and release the mask as needed during a deposition operation.

In one embodiment, a processing system is described. The processing system can include a process chamber (e.g., the vacuum chamber 110) configured to deposit a material on the substrate. The processing system can further include a permanent magnetic mask chuck positioned in the process chamber. The permanent magnetic mask chuck (e.g., permanent magnetic mask chuck 440, 450, 460) can include a positioning device (e.g., moveable connection 410, plurality of actuators 476*a*-476*j* or combinations thereof) and a plurality of permanent magnets (e.g., permanent magnets 474*a*-474*j*) coupled to the positioning device, the positioning device configured to control a magnitude of magnetic force provided to the mask (e.g., mask 430) such that the mask is magnetically chucked in position over the substrate.

The processing system can further include the positioning device being configured to move the permanent magnets in a sequential fashion.

The processing system can further include the positioning device being operable to position permanent magnets in a center portion of the permanent magnetic mask chuck closer to the mask relative to permanent magnets in a peripheral portion of the permanent magnetic mask chuck.

The processing system can further include a magnetic field produced by the permanent magnets being greater in a center portion of the permanent magnetic mask chuck relative to a peripheral portion of the permanent magnetic mask chuck.

The processing system can further include the positioning device being operable to position permanent magnets at one side of the permanent magnetic mask chuck closer to the mask relative to permanent magnets at an opposite side of the permanent magnetic mask chuck.

The processing system can further include a substrate carrier (e.g., substrate carrier 150*a* and 150*b*) for supporting a substrate (e.g., a first substrate 121*a* and a second substrate 121*b*), the substrate carrier comprising an electrode assembly (e.g., electrode assembly 306) configured to generate an electrostatic substrate chucking force, the electrode assembly and support base forming a unitary body configured for transport into and out of the processing chamber.

The processing system can further include the electrode assembly having a plurality of distributed electrodes (e.g., distributed electrodes 308, 310), the plurality of distributed electrodes further comprises interleaving a first electrode with a second electrode.

In another embodiment, a substrate carrier for use in a process chamber is described. The substrate carrier can include a support base configured to move into and out of a process chamber. The support base can include a substrate supporting surface and an electrode assembly operable to electrostatically chuck a substrate to the substrate supporting surface. The substrate carrier can further include a permanent magnetic mask chuck coupled to the support base. The permanent magnetic mask chuck can include a chuck body having a first wall and a second wall, the first wall being proximate to the support base and the second wall being distal to the support base, a plurality of permanent magnets positioned in the chuck body, the permanent magnets having a magnetic field and a positioning device to move the permanent magnetic mask chuck independent of the support base.

The substrate carrier can further include the plurality of permanent magnets being positionable within the chuck body such that a first magnet is closer to the substrate supporting surface than a second magnet.

The substrate carrier can further include the plurality of permanent magnets being moveable relative to the substrate supporting surface.

The substrate carrier can further include an actuator disposed in the chuck body and operable to control the position of the permanent magnets relative to the substrate supporting surface.

The substrate carrier can further include the plurality of permanent magnets being positionable to produce a magnetic force which applies more force to one portion of the mask relative to another portion of the mask.

The substrate carrier can further include positioning device being operable to move the plurality of permanent magnets to produce a stronger magnetic force at one portion of the substrate supporting surface relative to another portion of the substrate supporting surface.

The substrate carrier can further include the positioning device being operable to position move the permanent magnets closer to the substrate supporting surface in a center to edge sequence or an edge to opposite edge sequence.

The substrate carrier can further include the plurality of permanent magnets facing the substrate supporting surface having alternating polarity.

In another embodiment, a method for chucking a mask in a process chamber is described. The method can include transferring a substrate disposed on a substrate supporting surface of a substrate carrier into a process chamber. Then, a magnetic chuck can be moved towards the substrate supporting surface such that a plurality of permanent magnets of the magnetic chuck a mask to the substrate disposed on the substrate carrier. A layer can then be deposited through the mask onto the substrate.

Moving the magnetic chuck toward the substrate supporting surface can further include moving magnetic chuck towards the substrate carrier.

Moving the magnetic chuck toward the substrate supporting surface can further include moving the permanent magnets closer to a first region of the substrate supporting surface relative to a second region of the substrate supporting surface.

The method can further include the plurality of permanent magnets being disposed within the substrate carrier.

The method can further include the magnetic chuck being remote from the substrate carrier.

While the foregoing is directed to embodiments of the present invention, other and further embodiments of the invention may be devised without departing from the basic scope thereof, and the scope thereof is determined by the claims that follow.

What is claimed is:

1. A substrate carrier for use in a process chamber, the substrate carrier comprising:
    a support base configured to move into and out of a process chamber, the support base comprising:
        a substrate supporting surface; and
        an electrode assembly operable to electrostatically chuck a substrate to the substrate supporting surface; and
    a permanent magnetic mask chuck coupled to the support base, the permanent magnetic mask chuck comprising:
        a chuck body having a first wall and a second wall, the first wall being proximate to the support base and the second wall being distal to the support base;
        a plurality of permanent magnets positioned in the chuck body, the permanent magnets having a magnetic field; and
        a positioning device to move the permanent magnetic mask chuck independent of the support base.

2. The substrate carrier of claim 1, wherein the plurality of permanent magnets are positionable within the chuck body such that a first magnet is closer to the substrate supporting surface than a second magnet.

3. The substrate carrier of claim 1, wherein the plurality of permanent magnets are moveable relative to the substrate supporting surface.

4. The substrate carrier of claim 3, further comprising an actuator disposed in the chuck body and operable to control the position of the permanent magnets relative to the substrate supporting surface.

5. The substrate carrier of claim 1, wherein the plurality of permanent magnets are positionable to produce a magnetic force which applies more force to one portion of the mask relative to another portion of the mask.

6. The substrate carrier of claim 4, wherein the positioning device is operable to move the plurality of permanent magnets to produce a stronger magnetic force at one portion of the substrate supporting surface relative to another portion of the substrate supporting surface.

7. The substrate carrier of claim 4, wherein the positioning device is operable to move the permanent magnets closer to the substrate supporting surface in a center to edge sequence or an edge to opposite edge sequence.

8. The substrate carrier of claim 1, wherein the plurality of permanent magnets facing the substrate supporting surface have alternating polarity.

* * * * *

UNITED STATES PATENT AND TRADEMARK OFFICE
CERTIFICATE OF CORRECTION

| | | |
|---|---|---|
| PATENT NO. | : 9,959,961 B2 | Page 1 of 1 |
| APPLICATION NO. | : 14/463825 | |
| DATED | : May 1, 2018 | |
| INVENTOR(S) | : John M. White et al. | |

It is certified that error appears in the above-identified patent and that said Letters Patent is hereby corrected as shown below:

In Column 16, Line 46, in Claim 6, delete "4," and insert -- 5, --, therefor.

In Column 16, Line 51, in Claim 7, delete "4," and insert -- 5, --, therefor.

Signed and Sealed this
Third Day of July, 2018

Andrei Iancu
*Director of the United States Patent and Trademark Office*